(12) United States Patent
Deguchi et al.

(10) Patent No.: US 12,294,020 B2
(45) Date of Patent: May 6, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takafumi Deguchi, Nomi Ishikawa (JP); Kouta Tomita, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 379 days.

(21) Appl. No.: 17/882,335

(22) Filed: Aug. 5, 2022

(65) Prior Publication Data

US 2023/0307511 A1    Sep. 28, 2023

(30) Foreign Application Priority Data

Mar. 22, 2022    (JP) .................................. 2022-045859

(51) Int. Cl.
*H01L 29/40* (2006.01)
*H01L 29/66* (2006.01)
(Continued)

(52) U.S. Cl.
CPC .......... *H01L 29/407* (2013.01); *H01L 29/401* (2013.01); *H01L 29/66734* (2013.01); *H01L 29/7813* (2013.01); *H01L 29/4916* (2013.01)

(58) Field of Classification Search
CPC ................. H01L 29/407; H01L 29/401; H01L 29/66734; H01L 29/7813; H01L 29/4916;
(Continued)

(56) References Cited

U.S. PATENT DOCUMENTS 9,825,167 B2    11/2017    Matsuura et al.
9,954,055 B2     4/2018    Kobayashi et al.
(Continued)

FOREIGN PATENT DOCUMENTS

JP    2011-181809 A    9/2011
JP    2014-187194 A    10/2014
(Continued)

OTHER PUBLICATIONS

Zhang et al. ("Synergistic Boron Doping of Semiconductor and Dielectric Layers for High-Performance Metal Oxide Transistors: Interplay of Experiment and Theory," J. Am. Chem. Soc., 140, pp. 12501-12510, 2018) (Year: 2018).*

(Continued)

*Primary Examiner* — Yasser A Abdelaziz
(74) *Attorney, Agent, or Firm* — Kim & Stewart LLP

(57) ABSTRACT

According to one embodiment, a semiconductor device includes first and second electrodes, first to third semiconductor regions, a first conductive part, a first gate electrode. The first semiconductor region is located on the first electrode and electrically connected with the first electrode. The second semiconductor region is located on the first semiconductor region. The third semiconductor region is located on a portion of the second semiconductor region. The first conductive part is located in the first semiconductor region with a first insulating part interposed. The first gate electrode is located on the first conductive part with a first inter-layer insulating part interposed. The first gate electrode faces the second semiconductor region via a first gate insulating layer. The second electrode is located on the second and third semiconductor regions and electrically connected with the second and third semiconductor regions, and the first conductive part.

5 Claims, 9 Drawing Sheets

(51) Int. Cl.
*H01L 29/78* (2006.01)
*H01L 29/49* (2006.01)

(58) Field of Classification Search
CPC ............. H01L 29/0696; H01L 29/1095; H01L 29/41766; H01L 29/66727
See application file for complete search history.

(56) References Cited

U.S. PATENT DOCUMENTS

| | | |
|---|---|---|
| 11,094,816 B2 | 8/2021 | Shimomura |
| 2012/0187474 A1 | 7/2012 | Rexer et al. |
| 2013/0069147 A1* | 3/2013 | Ohta ................. H01L 29/66734 438/270 |
| 2014/0287574 A1 | 9/2014 | Takahashi et al. |
| 2015/0008479 A1* | 1/2015 | Kato ................. H01L 29/66348 438/138 |
| 2016/0071940 A1 | 3/2016 | Okumura |
| 2016/0079374 A1 | 3/2016 | Okumura |
| 2016/0079375 A1 | 3/2016 | Yamazaki |
| 2019/0043943 A1* | 2/2019 | Yoshida .............. H01L 29/0634 |
| 2019/0252269 A1* | 8/2019 | Toyoda ........... H01L 21/823892 |

FOREIGN PATENT DOCUMENTS

| | | |
|---|---|---|
| JP | 2015-222817 A | 12/2015 |
| JP | 2016-058485 A | 4/2016 |
| JP | 2016-063004 A | 4/2016 |
| JP | 2016062981 A | 4/2016 |
| JP | 2019-054273 A | 4/2019 |
| JP | 2020-004883 A | 1/2020 |
| JP | 2021-034444 A | 3/2021 |

OTHER PUBLICATIONS

Notice of Reasons for Refusal (Office Action) dated Mar. 26, 2025 in corresponding Japanese Patent Application No. 2022-045859 with English machine translation (8 pages).

* cited by examiner

SEMICONDUCTOR DEVICE

CROSS-REFERENCE TO RELATED APPLICATIONS

This application is based upon and claims the benefit of priority from Japanese Patent Application No. 2022-045859, filed on Mar. 22, 2022; the entire contents of which are incorporated herein by reference.

FIELD

Embodiments described herein relate generally to a semiconductor device.

BACKGROUND

Semiconductor devices such as metal oxide semiconductor field effect transistors (MOSFETs) and the like are used in, for example, power conversion. It is desirable to reduce the electrostatic capacitance of semiconductor devices.

DETAILED DESCRIPTION

Figure 1:
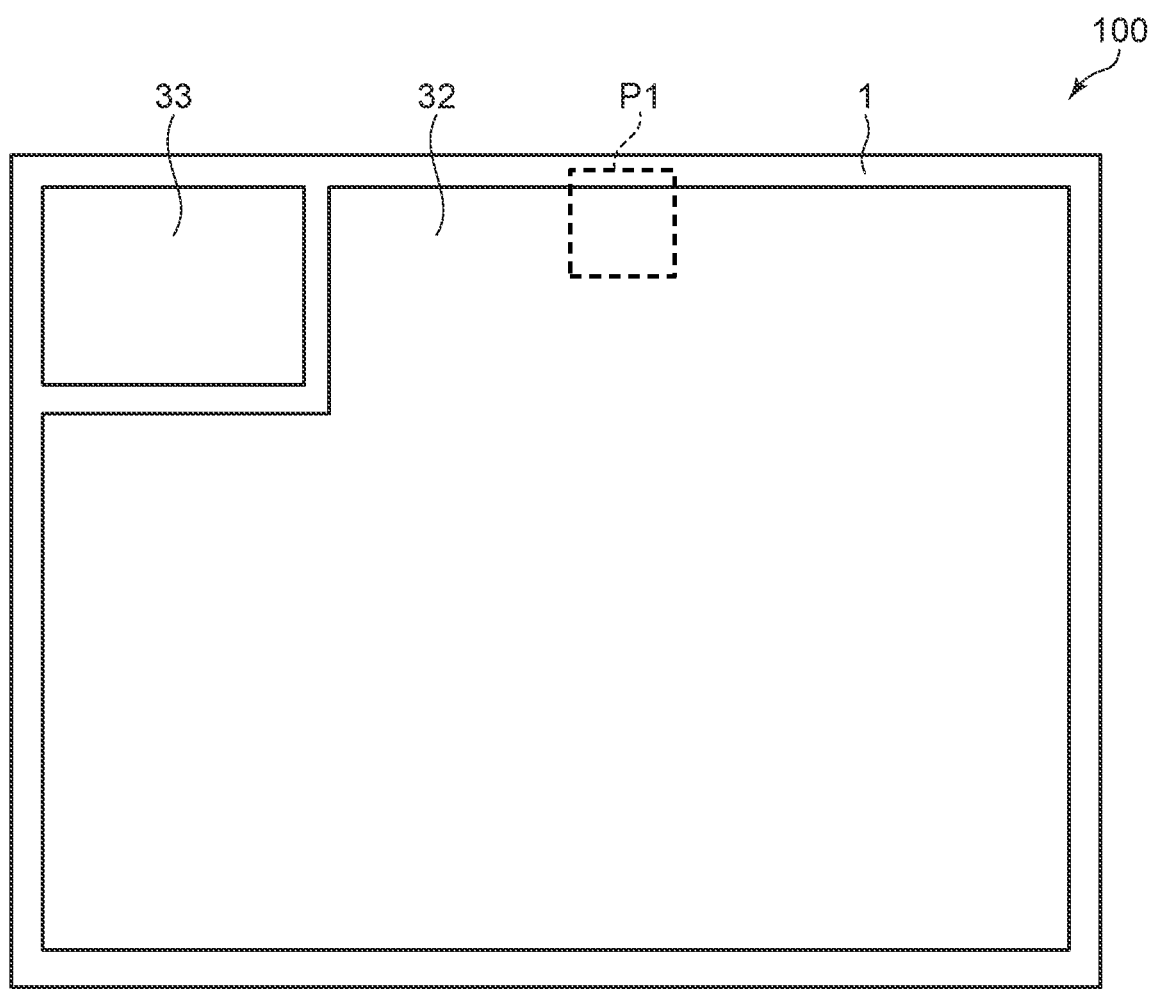
FIG. 1 is a plan view showing a semiconductor device according to a first embodiment.
Figure 1:
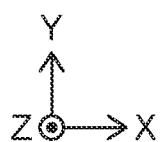

According to one embodiment, a semiconductor device includes a first electrode, a first semiconductor region of a first conductivity type, a second semiconductor region of a second conductivity type, a third semiconductor region of the first conductivity type, a first conductive part, a first gate electrode, and a second electrode. The first semiconductor region is located on the first electrode and electrically connected with the first electrode. The second semiconductor region is located on the first semiconductor region. The third semiconductor region is located on a portion of the second semiconductor region. The first conductive part is located in the first semiconductor region with a first insulating part interposed. The first conductive part includes an impurity of the second conductivity type. The first gate electrode is located on the first conductive part with a first inter-layer insulating part interposed. The first gate electrode includes an impurity of the first conductivity type. The first gate electrode faces the second semiconductor region via a first gate insulating layer in a second direction. The second direction is perpendicular to a first direction. The first direction is from the first electrode toward the first semiconductor region. The second electrode is located on the second and third semiconductor regions and electrically connected with the second semiconductor region, the third semiconductor region, and the first conductive part. A first-conductivity-type impurity concentration of the first inter-layer insulating part is greater than a first-conductivity-type impurity concentration of the first insulating part. A second-conductivity-type impurity concentration of the first inter-layer insulating part is greater than a second-conductivity-type impurity concentration of the first insulating part.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, n, $p^+$, and $p^-$ indicate relative levels of the impurity concentrations. Namely, a notation marked with "+" indicates that the impurity concentration is relatively greater than that of a notation not marked with either "+" or "−"; and a notation marked with "−" indicates that the impurity concentration is relatively less than that of an unmarked notation. When both a p-type impurity and an n-type impurity are included in each region, these notations indicate the relative level of the net impurity concentration after the impurities cancel.

According to embodiments described below, each embodiment may be implemented by inverting the p-type and the n-type of the semiconductor regions.

Figure 2:
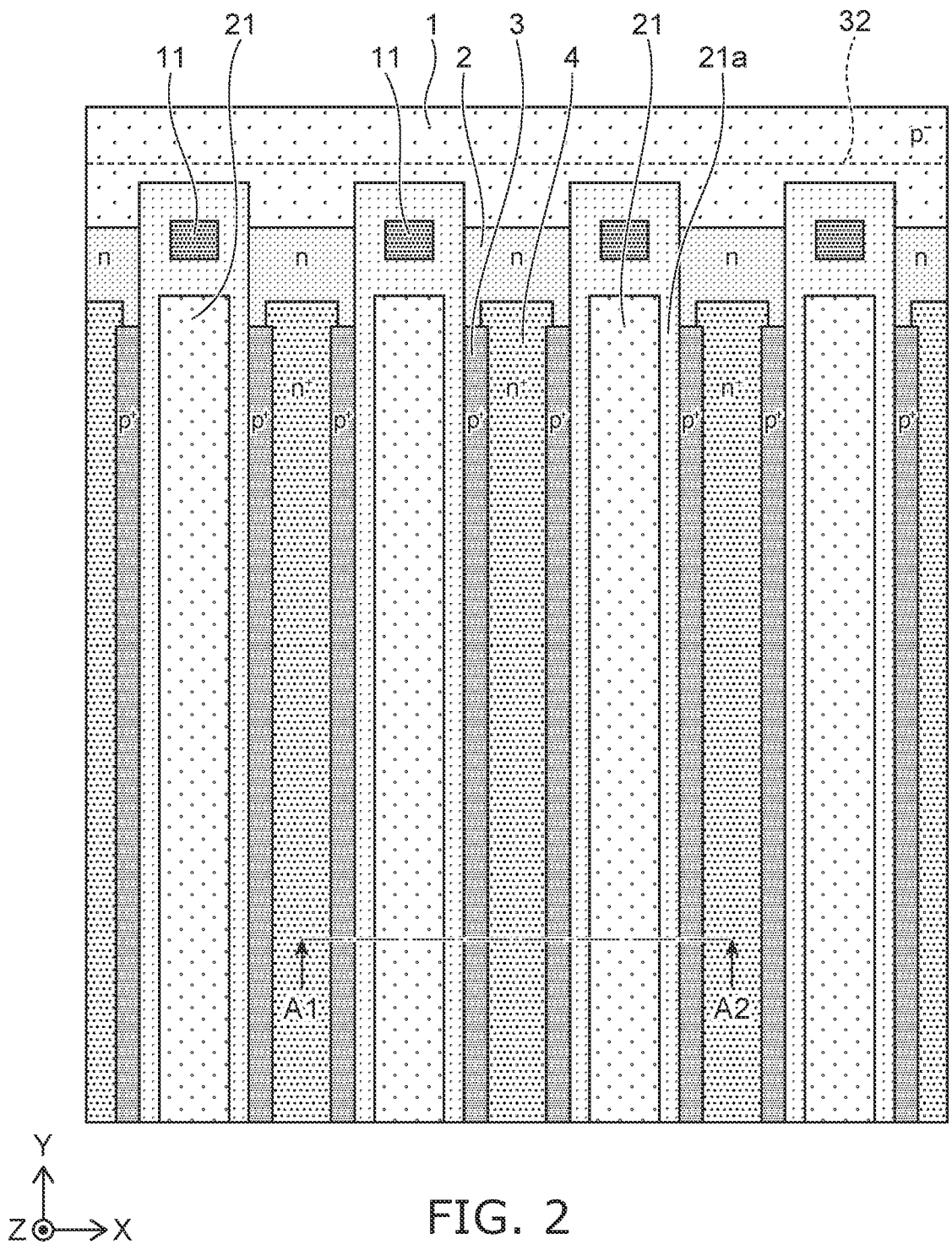
FIG. 2 is an enlarged view of portion P1 of FIG. 1.
Figure 3:
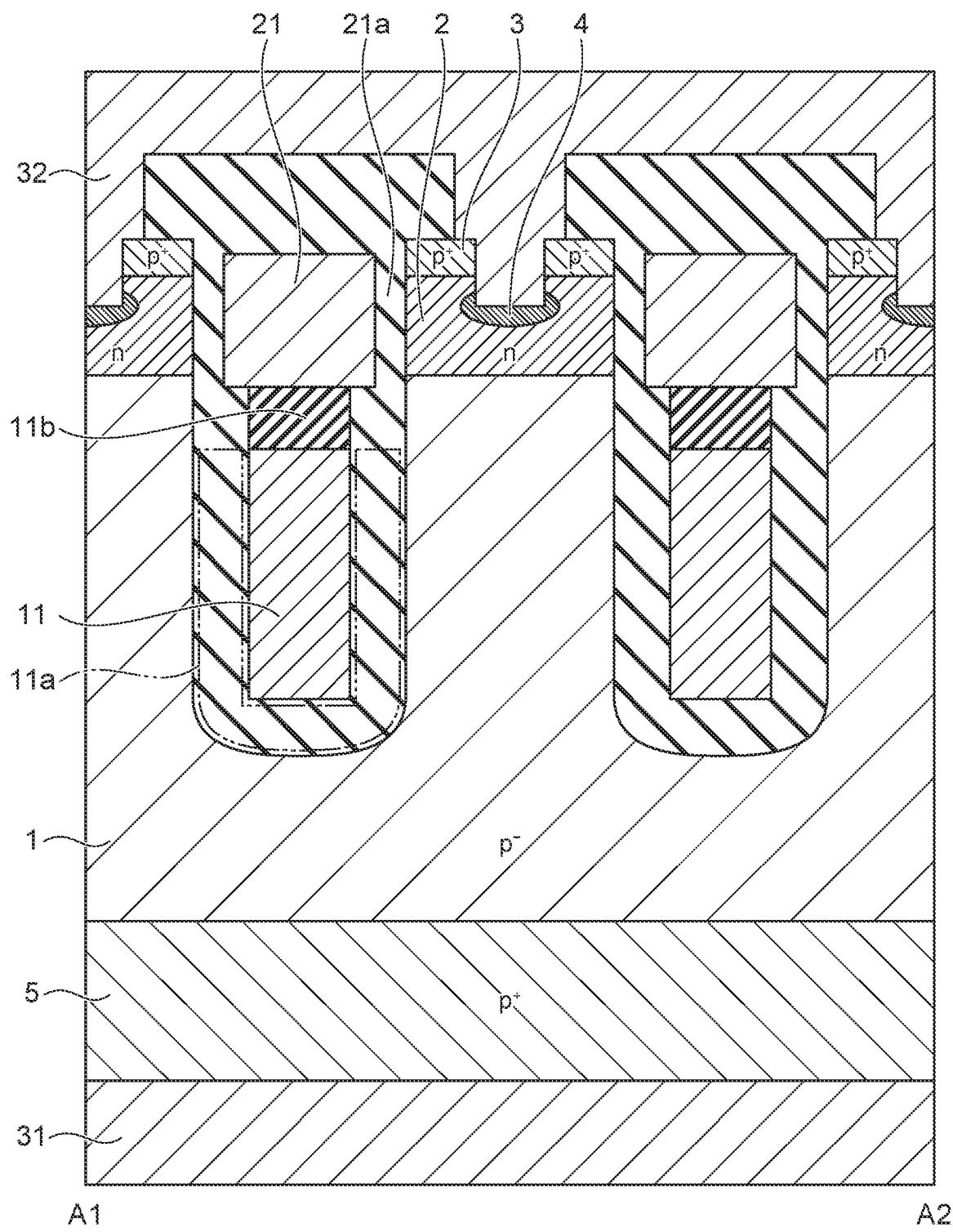
FIG. 3 is an A1-A2 cross-sectional view of FIG. 2.

FIG. 1 is a plan view showing a semiconductor device according to a first embodiment. FIG. 2 is an enlarged view of portion P1 of FIG. 1. FIG. 3 is an A1-A2 cross-sectional view of FIG. 2.

The semiconductor device 100 according to the embodiment is a MOSFET. As shown in FIGS. 1 to 3, the semiconductor device 100 according to the first embodiment includes a $p^-$-type (first-conductivity-type) drift region 1 (a first semiconductor region), an n-type (second-conductivity-type) base region 2 (a second semiconductor region), a $p^+$-type source region 3 (a third semiconductor region), an $n^+$-type contact region 4, a $p^+$-type drain region 5, a first conductive part 11, a first insulating part 11a, a first inter-layer insulating part 11b, a first gate electrode 21, a first gate insulating layer 21a, a drain electrode 31 (a first electrode), a source electrode 32 (a second electrode), and a gate pad 33. In FIG. 2, the source electrode 32 is illustrated by a broken line, and a portion of the first gate insulating layer 21a is not illustrated.

An XYZ orthogonal coordinate system is used in the description of the embodiments. The direction from the drain electrode 31 toward the $p^-$-type drift region 1 is taken as a Z-direction (a first direction). One direction perpendicular to the Z-direction is taken as an X-direction (a second direction). A direction perpendicular to the X-direction and the Z-direction is taken as a Y-direction. Herein, the direction from the drain electrode 31 toward the $p^-$-type drift region 1 also is called "up", and the opposite direction also is called "down". These directions are based on the relative positional relationship between the drain electrode 31 and the $p^-$-type drift region 1 and are independent of the direction of gravity.

As shown in FIG. 1, the source electrode 32 and the gate pad 33 are located at the upper surface of the semiconductor device 100. The source electrode 32 and the gate pad 33 are separated from each other and are electrically isolated.

As shown in FIG. 2, multiple first gate electrodes 21 are located under the source electrode 32. The multiple first gate electrodes 21 are arranged in the X-direction, and each extend in the Y-direction. Each first gate electrode 21 is electrically connected with the gate pad 33.

As shown in FIG. 3, the drain electrode 31 is located at the lower surface of the semiconductor device 100. The p$^+$-type drain region 5 is located on the drain electrode 31 and is electrically connected with the drain electrode 31. The p$^-$-type drift region 1 is located on the p$^+$-type drain region 5. The n-type impurity concentration in the p$^-$-type drift region 1 is less than the n-type impurity concentration in the p$^+$-type drain region 5. The p$^-$-type drift region 1 is electrically connected with the drain electrode 31 via the p$^+$-type drain region 5.

The n-type base region 2 is located on the p$^-$-type drift region 1. The p$^+$-type source region 3 is located on a portion of the n-type base region 2. The n$^+$-type contact region 4 is located on another portion of the n-type base region 2. The p-type impurity concentration in the n$^+$-type contact region 4 is greater than the p-type impurity concentration in the n-type base region 2.

The first conductive part 11 is located in the p$^-$-type drift region 1 with the first insulating part 11a interposed. The first gate electrode 21 is located on the first conductive part 11 with the first inter-layer insulating part 11b interposed. The first gate electrode 21 faces the n-type base region 2 via the first gate insulating layer 21a in the X-direction. In the illustrated example, the first gate electrode 21 faces both a portion of the p$^-$-type drift region 1 and a portion of the p$^+$-type source region 3.

The source electrode 32 is located on the p$^+$-type source region 3 and the n$^+$-type contact region 4 and is electrically connected with the p$^+$-type source region 3, the n$^+$-type contact region 4, and the first conductive part 11. The n-type base region 2 is electrically connected with the source electrode 32 via the n$^+$-type contact region 4. The first gate electrode 21 is electrically isolated from the source electrode 32 by the first gate insulating layer 21a.

As shown in FIGS. 2 and 3, pluralities of each of the n-type base regions 2, the p$^+$-type source regions 3, the n$^+$-type contact regions 4, and the first conductive parts 11 are arranged in the X-direction and extend in the Y-direction. In the illustrated example, a pair of p$^+$-type source regions 3 is located on one n-type base region 2. Multiple pairs of p$^+$-type source regions 3 are located on the multiple n-type base regions 2. The multiple first conductive parts 11 are located in the p$^-$-type drift region 1 with the multiple first insulating parts 11a interposed. The Y-direction end portion of each first conductive part 11 is drawn upward and electrically connected with the source electrode 32. The multiple first gate electrodes 21 are located on the multiple first conductive parts 11 with the multiple first inter-layer insulating parts 11b interposed. Also, the multiple first gate electrodes 21 face the multiple n-type base regions 2 with the multiple first gate insulating layers 21a interposed.

Operations of the semiconductor device 100 will now be described.

A negative voltage that is not less than a threshold is applied to the first gate electrode 21 in a state in which a positive voltage with respect to the drain electrode 31 is applied to the source electrode 32. Thereby, a channel (an inversion layer) is formed in the n-type base region 2; and the semiconductor device 100 is set to the on-state. Holes pass through the channel and flow from the source electrode 32 toward the drain electrode 31. When the negative voltage applied to the first gate electrode 21 drops below the threshold, the channel of the n-type base region 2 disappears, and the semiconductor device 100 switches to the off-state.

When the semiconductor device 100 switches to the off-state, the negative voltage that is applied to the drain electrode 31 increases with respect to the source electrode 32. At this time, a depletion layer spreads toward the p$^-$-type drift region 1 from the interface between the first insulating part 11a and the p$^-$-type drift region 1. The breakdown voltage of the semiconductor device 100 can be increased by the spreading of the depletion layer. Or, the p-type impurity concentration in the p$^-$-type drift region 1 can be increased and the on-resistance of the semiconductor device 100 can be reduced while maintaining the breakdown voltage of the semiconductor device 100.

Examples of the materials of the components of the semiconductor device 100 will now be described.

The p$^-$-type drift region 1, the n-type base region 2, the p$^+$-type source region 3, the n$^+$-type contact region 4, and the p$^+$-type drain region 5 include silicon, silicon carbide, gallium nitride, or gallium arsenide as the semiconductor material. When silicon is used as the semiconductor material, arsenic, phosphorus, or antimony can be used as the n-type impurity. Boron can be used as the p-type impurity.

The first insulating part 11a, the first inter-layer insulating part 11b, and the first gate insulating layer 21a include an insulating material. For example, the first insulating part 11a, the first inter-layer insulating part 11b, and the first gate insulating layer 21a include silicon oxide, silicon nitride, or silicon oxynitride. The drain electrode 31 and the source electrode 32 include a metal such as titanium, tungsten, aluminum, etc.

The first conductive part 11 and the first gate electrode 21 include a conductive material such as polysilicon, etc. The first conductive part 11 includes an impurity of one of the n-type or the p-type. The first gate electrode 21 includes the impurity of the other of the n-type or the p-type. In other words, the first conductive part 11 and the first gate electrode 21 include impurities of mutually-different conductivity types. Favorably, the first conductive part 11 includes an n-type impurity; and the first gate electrode 21 includes a p-type impurity.

The first conductive part 11 and the first gate electrode 21 may include both an n-type impurity and a p-type impurity. In such a case, the impurity concentration of one of the n-type or the p-type of the first conductive part 11 is greater than the impurity concentration of the other of the n-type or the p-type of the first gate electrode 21. The impurity concentration of the other of the n-type or the p-type of the first conductive part 11 is greater than the impurity concentration of the one of the n-type or the p-type of the first gate electrode 21. For example, the n-type impurity concentration is greater than the p-type impurity concentration in the first conductive part 11; and the p-type impurity concentration is greater than the n-type impurity concentration in the first gate electrode 21.

FIGS. 4A to 6B are cross-sectional views showing a method for manufacturing the semiconductor device according to the embodiment.

Figure 4A:
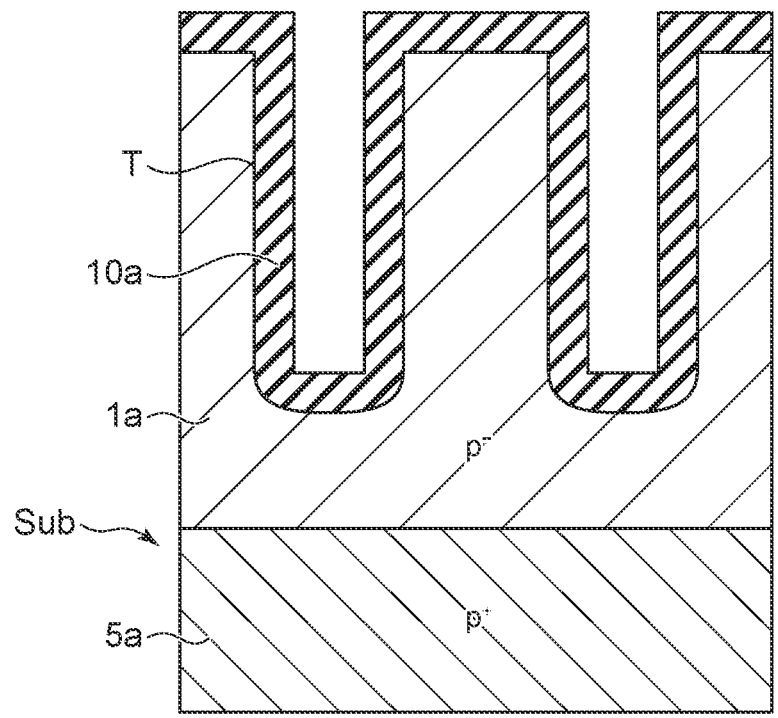
FIGS. 4A and 4B are cross-sectional views showing a method for manufacturing the semiconductor device according to the embodiment.

An example of the method for manufacturing the semiconductor device 100 according to the first embodiment is described with reference to FIGS. 4A to 6B. First, a semiconductor substrate Sub that includes a p$^+$-type semiconductor layer 5a is prepared. A p⁻-type semiconductor layer 1a is formed by epitaxially growing silicon on the p⁺-type semiconductor layer 5a. Multiple trenches T are formed in the upper surface of the p⁻-type semiconductor layer 1a. As shown in FIG. 4A, an insulating layer 10a is formed along the upper surface of the p⁻-type semiconductor layer 1a and the inner surfaces of the trenches T by thermal oxidation.

Figure 4B:
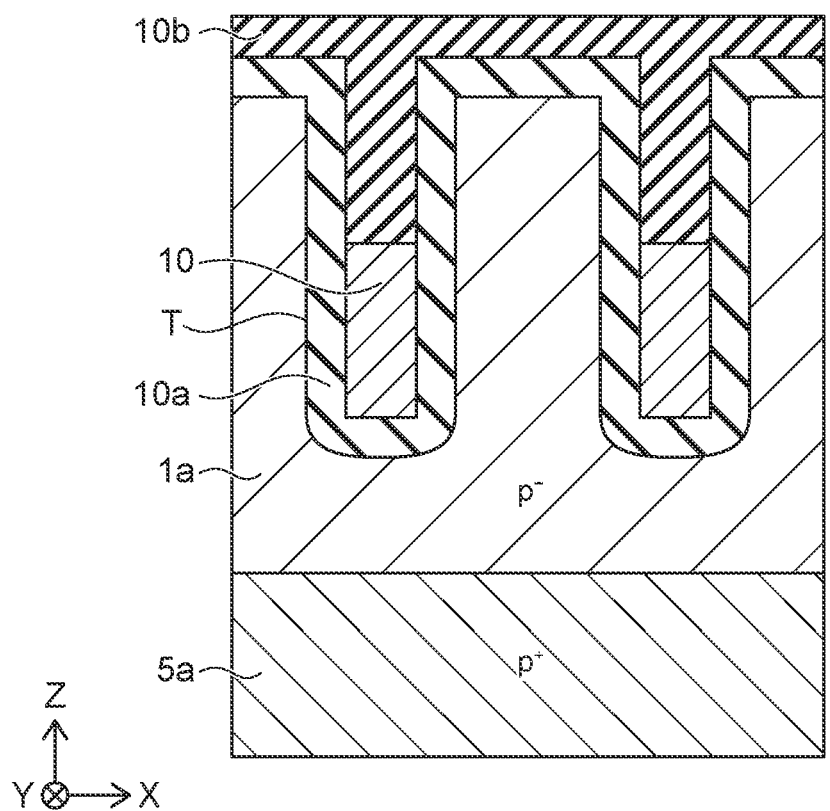

A conductive layer 10 that fills the trenches T is formed on the insulating layer 10a. The conductive layer 10 is formed by chemical vapor deposition (CVD) of a conductive material such as polysilicon, etc. An n-type impurity is ion-implanted into the conductive layer 10. The n-type impurity is diffused inside the conductive layer 10 and activated by heat treatment. The upper surface of the conductive layer 10 is caused to recede by chemical dry etching (CDE), etc. Thereby, the separated multiple conductive layers 10 are formed respectively in the multiple trenches T. As shown in FIG. 4B, an insulating layer 10b is formed on the insulating layer 10a and the multiple conductive layers 10. The insulating layer 10b is formed by CVD of boron phosphorus silicate glass (BPSG). Therefore, compared to the insulating layer 10a, the insulating layer 10b includes more of the n-type impurity and the p-type impurity.

Figure 5A:
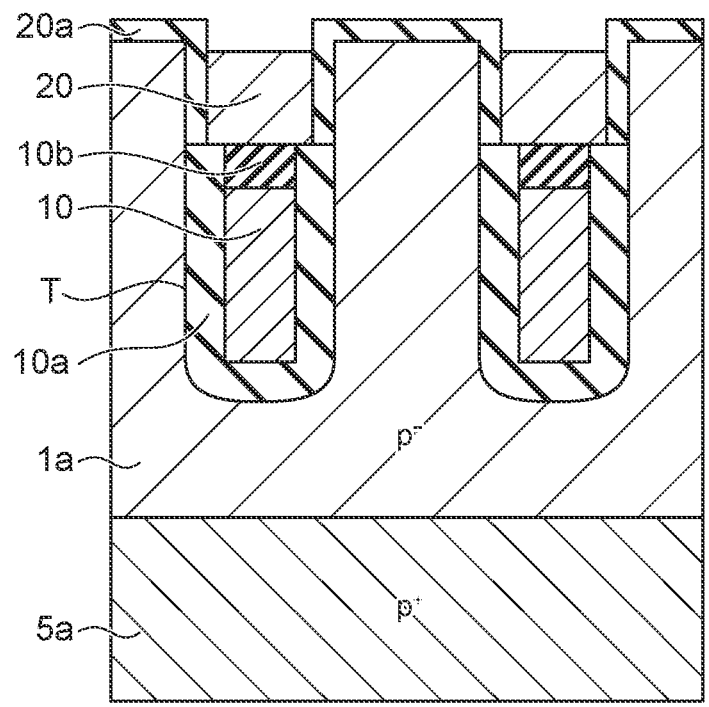
FIGS. 5A and 5B are cross-sectional views showing a method for manufacturing the semiconductor device according to the embodiment.

The upper surface of the insulating layer 10a and the upper surface of the insulating layer 10b are caused to recede by wet etching. The upper surface of the p⁻-type semiconductor layer 1a and portions of the side surfaces of the trenches T are exposed thereby. An insulating layer 20a is formed by thermal oxidation on the upper surface of the p⁻-type semiconductor layer 1a and the sidewalls of the trenches T that are exposed. The thickness of the insulating layer 20a is less than the thickness of the insulating layer 10a. A conductive layer 20 is formed on the insulating layer 20a. A p-type impurity is ion-implanted into the conductive layer 20. The p-type impurity is diffused inside the conductive layer 20 and activated by heat treatment. As shown in FIG. 5A, the upper surface of the conductive layer 20 is caused to recede by CDE or wet etching, and the conductive layer 20 is formed inside each of the trenches T.

Figure 5B:
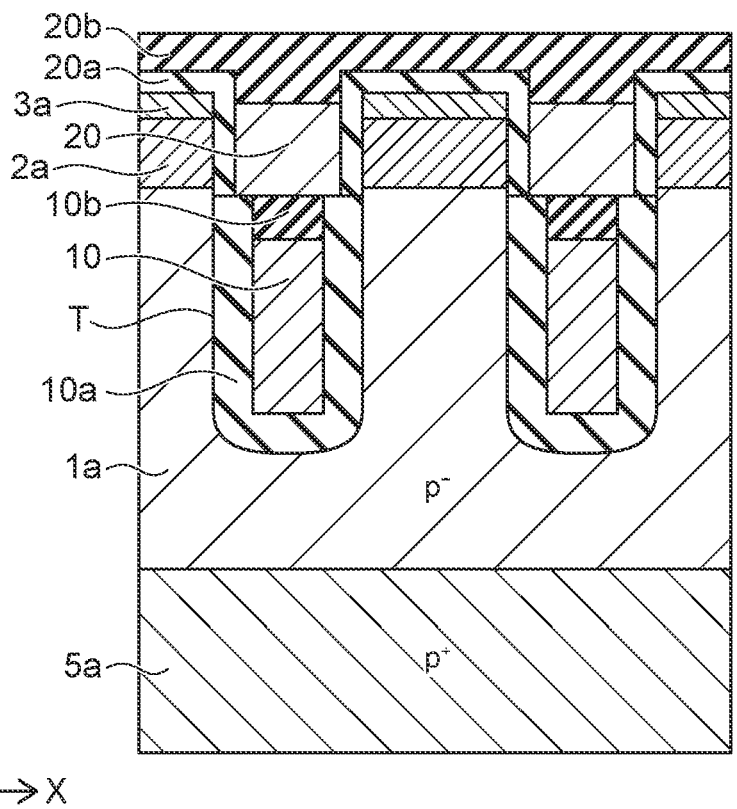

An n-type semiconductor region 2a and a p⁺-type semiconductor region 3a are formed by sequentially ion-implanting an n-type impurity and a p-type impurity into the upper portion of the p⁻-type semiconductor layer 1a between the trenches T. As shown in FIG. 5B, an insulating layer 20b that covers the multiple conductive layers 20 is formed.

Figure 6A:
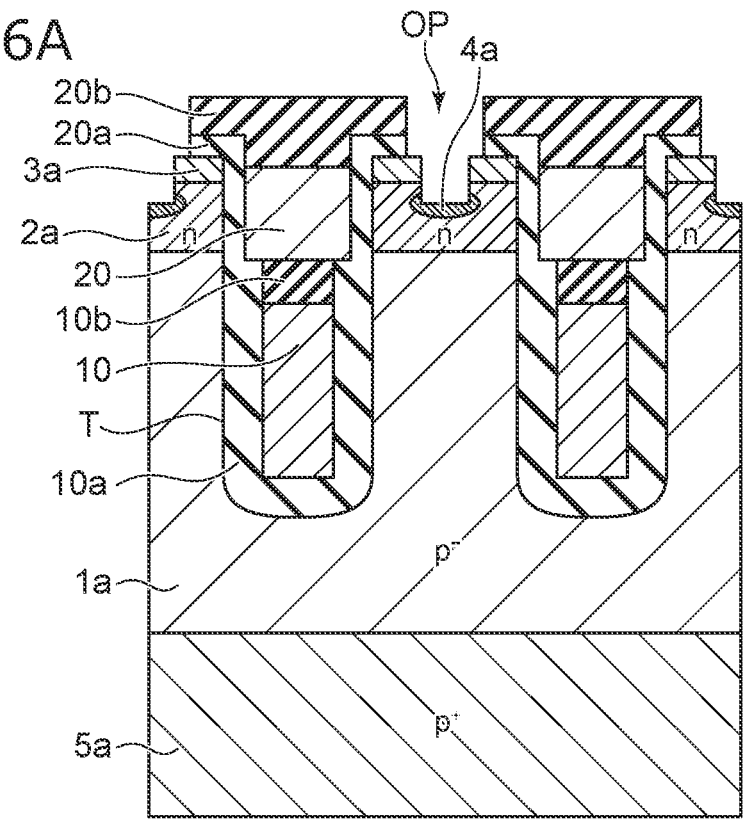
FIGS. 6A and 6B are cross-sectional views showing a method for manufacturing the semiconductor device according to the embodiment.

Openings OP that extend through the insulating layer 20b, the insulating layer 20a, and the p⁺-type semiconductor region 3a and reach the n-type semiconductor region 2a are formed. As shown in FIG. 6A, n⁺-type semiconductor regions 4a are formed by ion-implanting a p-type impurity into the n-type semiconductor region 2a via the openings OP.

Figure 6B:
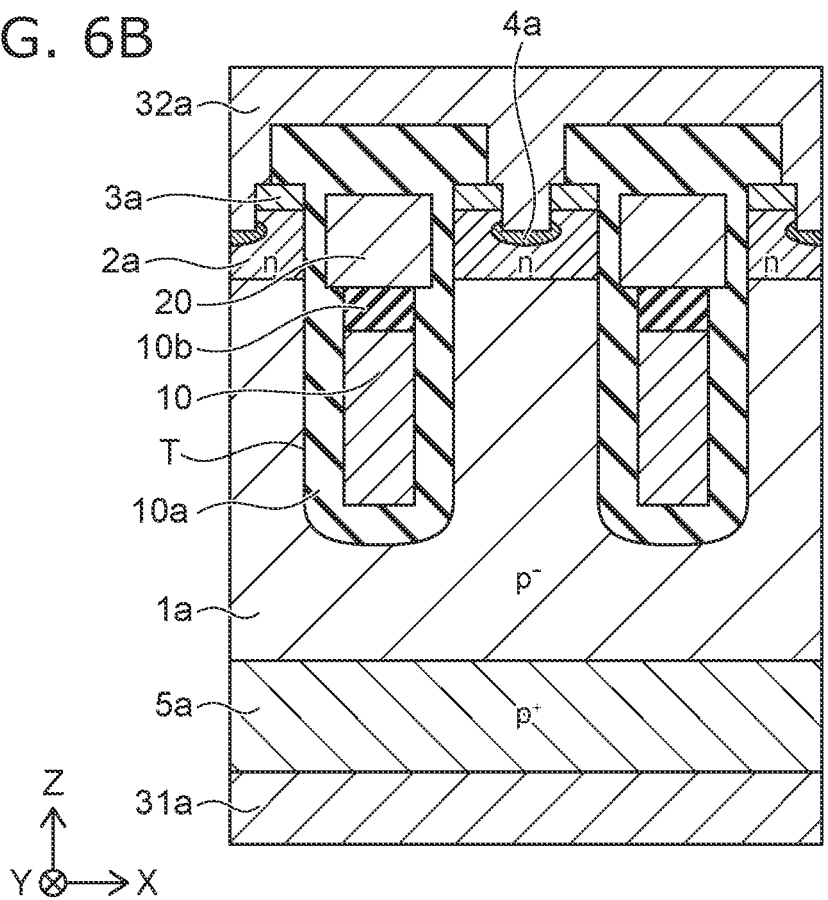

A metal layer 32a that fills the openings OP is formed on the insulating layer 20b. Subsequently, the lower surface of the semiconductor substrate Sub is polished until the p⁺-type semiconductor layer 5a has a prescribed thickness. As shown in FIG. 6B, a metal layer 31a is formed on the polished lower surface. The semiconductor device 100 shown in FIG. 1 is manufactured by the processes described above.

The p⁻-type semiconductor layer 1a shown in FIG. 6B corresponds to the p⁻-type drift region 1 shown in FIG. 1. The n-type semiconductor region 2a corresponds to the n-type base region 2. The p⁺-type semiconductor region 3a corresponds to the p⁺-type source region 3. The n⁺-type semiconductor region 4a corresponds to the n⁺-type contact region 4. The p⁺-type semiconductor layer 5a corresponds to the p⁺-type drain region 5. The conductive layer 10 corresponds to the first conductive part 11. The insulating layer 10a corresponds to the first insulating part 11a. The insulating layer 10b corresponds to the first inter-layer insulating part 11b. The conductive layer 20 corresponds to the first gate electrode 21. The insulating layers 20a and 20b correspond to the first gate insulating layer 21a. The metal layer 31a corresponds to the drain electrode 31. The metal layer 32a corresponds to the source electrode 32.

Advantages of the embodiments will now be described.

The p⁻-type drift region 1 and the first conductive part 11 face each other via the first insulating part 11a. Therefore, an electrostatic capacitance is formed between the p⁻-type drift region 1 and the first conductive part 11. According to the embodiment, the p⁻-type drift region 1 and the first conductive part 11 include impurities of mutually-different conductivity types. According to this structure, the work function of the first conductive part 11 is increased, and the first conductive part 11 has a higher potential than the p⁻-type drift region 1 facing the first conductive part 11 via the first insulating part 11a. A depletion layer spreads from the interface of the first insulating part 11a toward the p⁻-type drift region 1 due to the potential difference between the first conductive part 11 and the p⁻-type drift region 1. The depletion layer spreads and the holes at the vicinity of the first insulating part 11a are expelled, thereby reducing the electrostatic capacitance between the p⁻-type drift region 1 and the first conductive part 11. In other words, a capacitance Cds between the drain electrode 31 and the source electrode 32 is reduced. The capacitance Cds has a relationship with an output capacitance Coss of the semiconductor device 100. When the capacitance Cds increases, the output capacitance Coss also increases. As the output capacitance Coss increases, the time necessary for charging or discharging the output capacitance Coss when switching the semiconductor device 100 lengthens. According to the embodiment, the output capacitance Coss of the semiconductor device 100 can be reduced, and the switching loss of the semiconductor device 100 can be reduced.

Also, in the p⁻-type drift region 1 between the first conductive parts 11, a depletion layer spreads from the interface between the first insulating part 11a and the p⁻-type drift region 1, thereby expelling the holes at the vicinity of the first gate insulating layer 21a as well, and reducing the electrostatic capacitance between the p⁻-type drift region 1 and the first gate electrode 21. In other words, a capacitance Cgd between the drain electrode 31 and the first gate electrode 21 is reduced. The capacitance Cgd corresponds to a reverse transfer capacitance Crss of the semiconductor device 100. By reducing the capacitance Cgd, the reverse transfer capacitance Crss also is reduced. The reverse transfer capacitance Crss affects the length of the transition period until the semiconductor device 100 fully reaches the on-state when turning on the semiconductor device 100. As the reverse transfer capacitance Crss increases, the transition period lengthens, and the switching loss of the semiconductor device 100 increases. According to the embodiment, in addition to the output capacitance Coss, the reverse transfer capacitance Crss of the semiconductor device 100 also can be reduced, and as a result, the switching loss of the semiconductor device 100 can be further reduced.

In the manufacturing processes of the semiconductor device 100, impurities that are included in the p⁺-type drain region 5 may diffuse via the p⁻-type drift region 1 to the first conductive part 11. When the impurity concentration of the first conductive part 11 increases, the capacitance Cds between the p⁻-type drift region 1 and the first conductive part 11 is increased, and the capacitance Cds is increased. Although the diffusion of the impurity into the first conductive part 11 can be suppressed by making the p⁻-type drift region 1 thick, the on-resistance of the semiconductor device 100 increases. When the p⁻-type drift region 1 and the first conductive part 11 include impurities of mutually-different conductivity types, the increase of the capacitance Cds can be suppressed and the increase of the switching loss of the semiconductor device 100 can be suppressed even when the impurity diffuses into the first conductive part 11.

More favorably, the first conductive part 11 and the first gate electrode 21 include impurities of mutually-different conductivity types. In other words, the p⁻-type drift region 1 and the first gate electrode 21 include impurities of the same conductivity type, and include impurities of a different conductivity type from the impurity of the first conductive part 11. According to this configuration, compared to when the first conductive part 11 and the first gate electrode 21 include impurities of the same conductivity type, the work function difference between the first conductive part 11 and the first gate electrode 21 is reduced, and the capacitance between the first conductive part 11 and the first gate electrode 21 is increased. Although a capacitance Cgs between the first gate electrode 21 and the source electrode 32 is increased, the reduction of the capacitance Cgd is larger, and as a result, an input capacitance Ciss of the semiconductor device 100 is reduced.

Favorable impurity concentrations of the components are illustrated below.

The p-type impurity concentration in the p⁻-type drift region 1 is greater than $1.0 \times 10^{16}$ atoms/cm³ and less than $1.0 \times 10^{18}$ atoms/cm³. The n-type impurity concentration in the n-type base region 2 is greater than $1.0 \times 10^{16}$ atoms/cm³ and less than $1.0 \times 10^{18}$ atoms/cm³. The p-type impurity concentration in the p⁺-type source region 3 is greater than $1.0 \times 10^{17}$ atoms/cm³ and less than $1.0 \times 10^{21}$ atoms/cm³. The n-type impurity concentration in the first conductive part 11 is greater than $1.0 \times 10^{19}$ atoms/cm³ and less than $1.0 \times 10^{21}$ atoms/cm³. The p-type impurity concentration in the first gate electrode 21 is greater than $1.0 \times 10^{19}$ atoms/cm³ and less than $1.0 \times 10^{21}$ atoms/cm³.

There is a possibility that the first conductive part 11 and the first gate electrode 21 may not act as electrodes if the impurity concentrations of these electrodes are less than $1.0 \times 10^{19}$ atoms/cm³. As a result, there is a possibility that the breakdown voltage may decrease, the on-resistance may increase, or threshold fluctuation of the gate voltage for turn-on may occur. When the impurity concentrations of the first conductive part 11 and the first gate electrode 21 are greater than $1.0 \times 10^{21}$ atoms/cm³, there is a possibility that the impurities may diffuse into the semiconductor regions, the breakdown voltage may decrease, the on-resistance may increase, or threshold fluctuation of the gate voltage for turn-on may occur.

In the semiconductor device 100, the first inter-layer insulating part 11b includes impurities of both the n-type and the p-type. The n-type impurity concentration of the first inter-layer insulating part 11b is greater than the n-type impurity concentration of the first insulating part 11a. The p-type impurity concentration of the first inter-layer insulating part 11b is greater than the p-type impurity concentration of the first insulating part 11a. According to this configuration, the gettering effect of the first inter-layer insulating part 11b for mobile ions, n-type impurities, p-type impurities, etc., can be increased. For example, mobile ions from outside the first insulating part 11a and the first inter-layer insulating part 11b can be supplemented by the first inter-layer insulating part 11b. The impurities that diffuse between the first conductive part 11 and the first gate electrode 21 can be trapped. As a result, the characteristic fluctuation of the semiconductor device 100 due to movement of mobile ions or impurities into the first conductive part 11 or the first gate electrode 21 can be suppressed.

Second Embodiment

Figure 7:
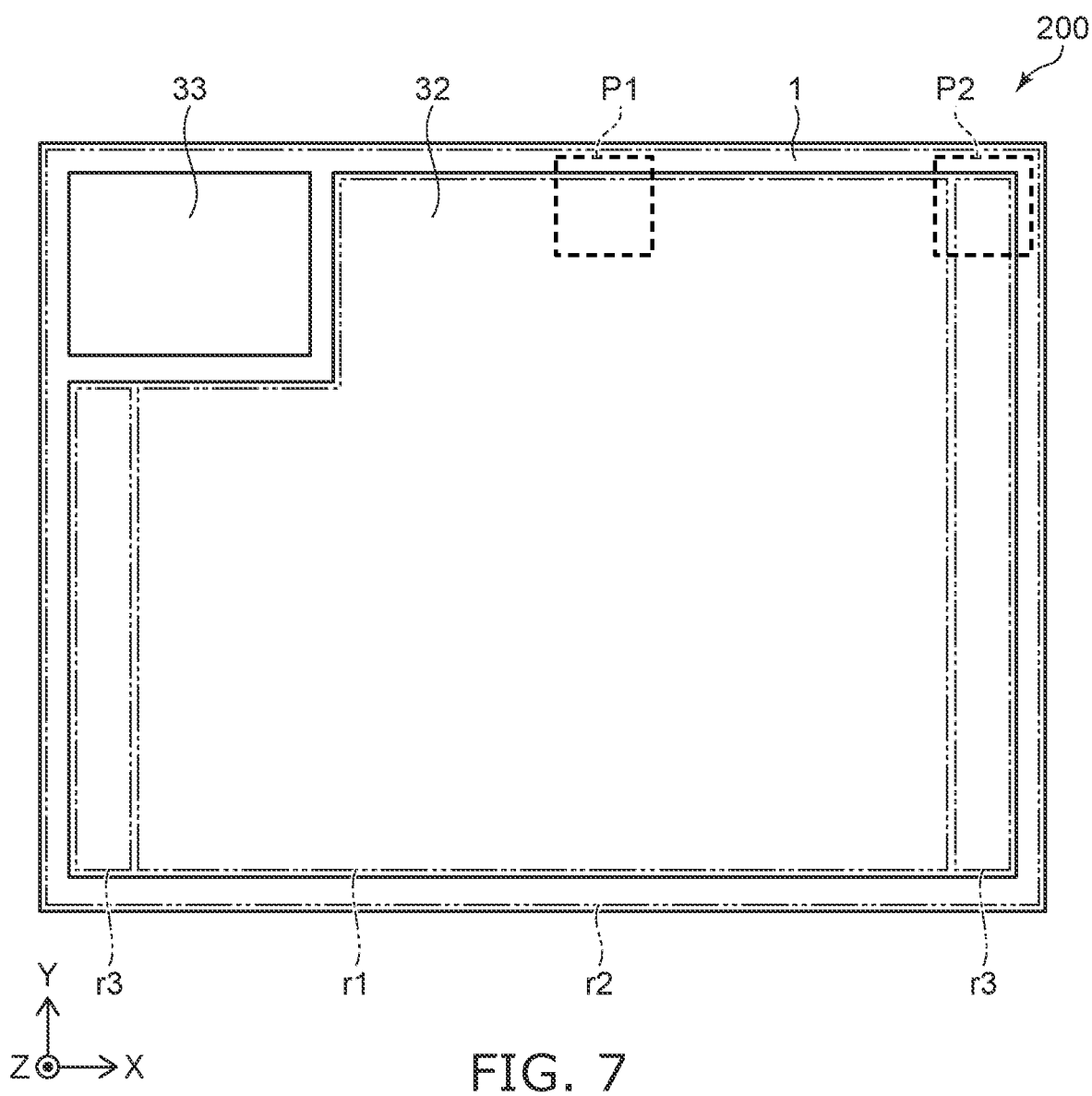
FIG. 7 is a plan view showing a semiconductor device according to a second embodiment.
Figure 8:
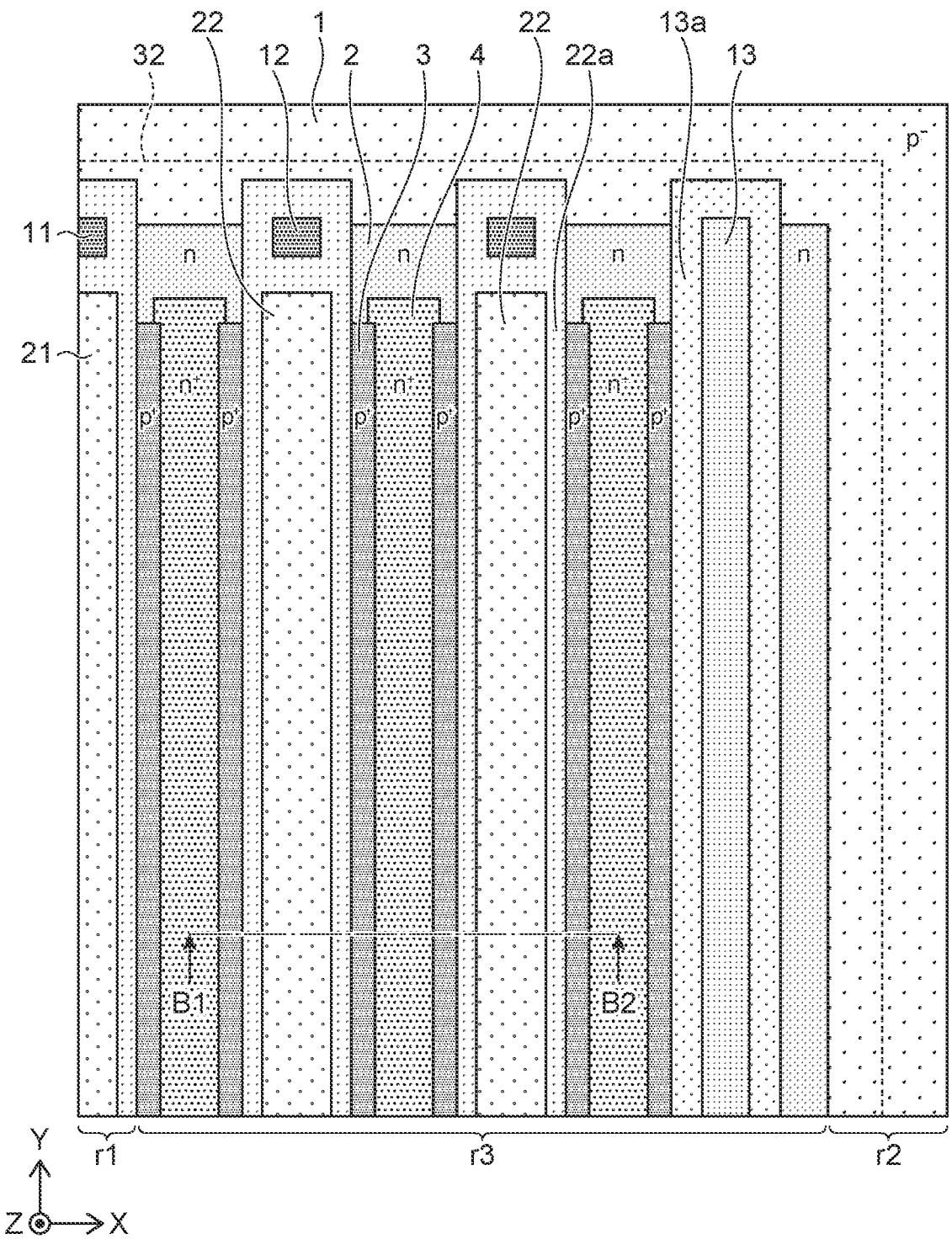
FIG. 8 is an enlarged view of portion P2 of FIG. 7.
Figure 9:
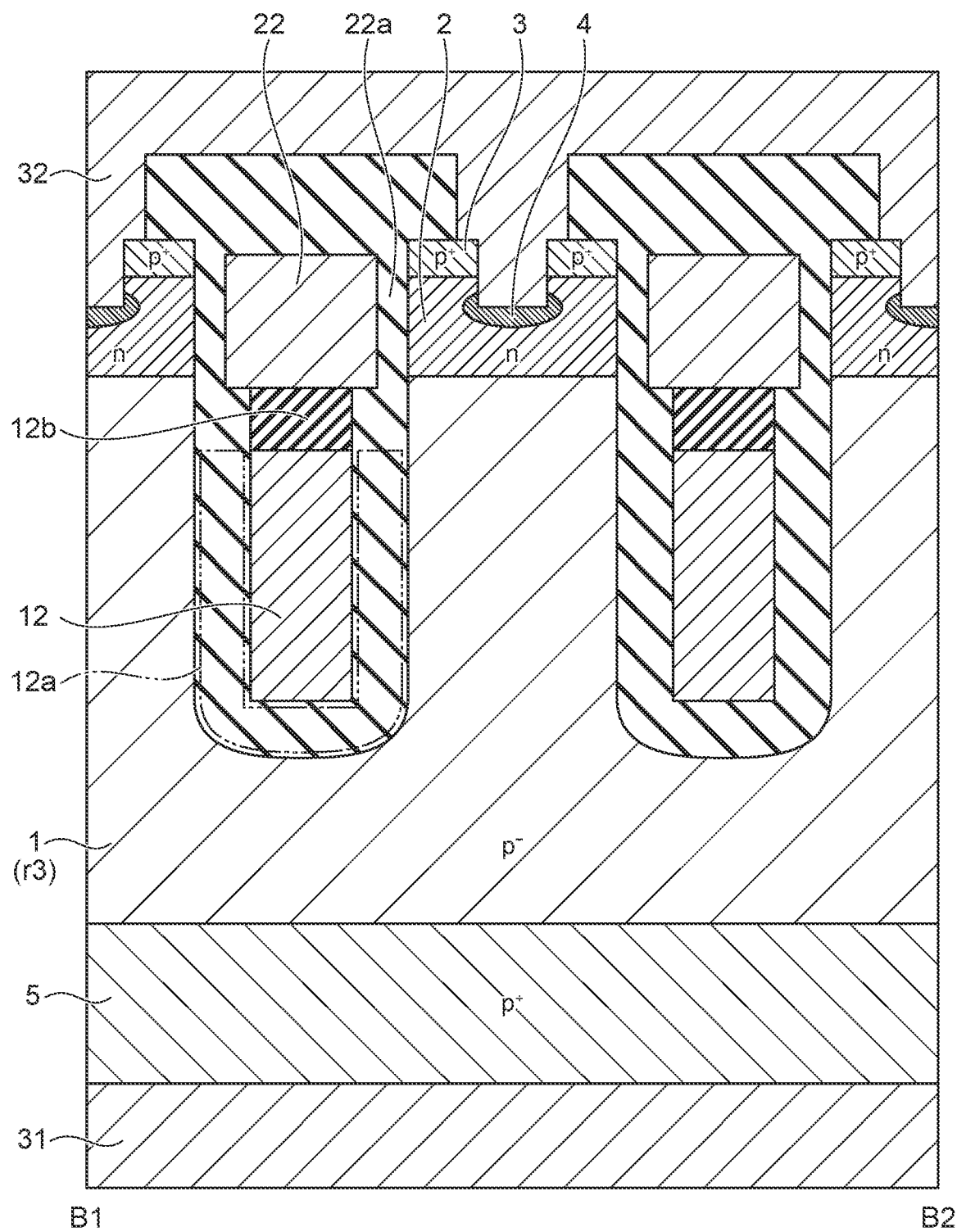
FIG. 9 is a B1-B2 cross-sectional view of FIG. 8.

FIG. 7 is a plan view showing a semiconductor device according to a second embodiment. FIG. 8 is an enlarged view of portion P2 of FIG. 7. FIG. 9 is a B1-B2 cross-sectional view of FIG. 8.

As shown in FIGS. 7 to 9, compared to the semiconductor device 100, the semiconductor device 200 according to the second embodiment further includes a second conductive part 12, a second insulating part 12a, a second inter-layer insulating part 12b, a second gate electrode 22, and a second gate insulating layer 22a. In FIG. 8, the source electrode 32 is illustrated by a broken line, and a portion of the second gate insulating layer 22a is not illustrated.

In the semiconductor device 200 as shown in FIG. 7, the p⁻-type drift region 1 includes first to third regions r1 to r3. The second region r2 is located around the first region r1 along the X-Y plane (a first plane). The third region r3 is located between the first region r1 and the second region r2 in the X-direction. The first region r1 and the third region r3 correspond to an element region through which the current flows when the semiconductor device 200 is in the on-state. The second region r2 corresponds to a termination region for increasing the breakdown voltage of the semiconductor device 200. In the illustrated example, a pair of third regions r3 is separated from each other in the X-direction. The first region r1 is positioned between the pair of third regions r3.

As shown in FIG. 8, the second gate electrode 22 is located under the source electrode 32. The second gate electrode 22 is positioned on the third region r3. The second gate electrode 22 extends in the Y-direction along the first gate electrode 21. As illustrated, multiple second gate electrodes 22 may be arranged in the X-direction. The Y-direction end portion of the second gate electrode 22 is electrically connected with the gate pad 33 via gate wiring 33a.

As shown in FIG. 9, the second conductive part 12 is located in the third region r3 of the p⁻-type drift region 1 with the second insulating part 12a interposed. The second conductive part 12 is electrically connected with the source electrode 32. The second gate electrode 22 is located on the second conductive part 12 with the second inter-layer insulating part 12b interposed. The second gate electrode 22 faces the n-type base region 2 via the second gate insulating layer 22a in the X-direction. In the illustrated example, the second gate electrode 22 also faces a portion of the p⁻-type drift region 1 and a portion of the p⁺-type source region 3. The second gate electrode 22 is electrically isolated from the source electrode 32 by the second gate insulating layer 22a.

The second conductive part 12 and the second gate electrode 22 include a conductive material such as polysilicon, etc. The second conductive part 12 and the second gate electrode 22 include impurities of the same conductivity type. Favorably, the p⁻-type drift region 1, the second conductive part 12, and the second gate electrode 22 include p-type impurities. For example, the p-type impurity concentration is greater than the n-type impurity concentration in the second conductive part 12; and the p-type impurity concentration is greater than the n-type impurity concentration in the second gate electrode 22.

The structure of the semiconductor device 200 in portion P1 shown in FIG. 7 is similar to the structure of the semiconductor device 100 of portion P1 shown in FIG. 2.

The cross-sectional structure of the semiconductor device 200 in portion P1 is similar to the cross-sectional structure of the semiconductor device 100 shown in FIG. 3. As shown in FIG. 8, the first gate electrode 21 is positioned on the first region r1. A third conductive part 13 may be located in the second region r2 with a third insulating 10 part 13a interposed. The third conductive part 13 is electrically connected with the source electrode 32 and includes an n-type impurity. For example, the n-type impurity concentration is greater than the p-type impurity concentration in the third conductive part 13.

When the conductivity type of the impurity included in the second conductive part 12 is the same as the conductivity type of the p⁻-type drift region 1, the potential difference between the p⁻-type drift region 1 and the second conductive part 12 is reduced. Compared to when the conductivity type of the p⁻-type drift region 1 and the conductivity type of the impurity included in the second conductive part 12 are different, the depletion layer that spreads toward the p⁻-type drift region 1 is reduced. Therefore, the on-resistance per unit area in the third region r3 is less than the on-resistance per unit area in the first region r1. By providing the third region r3 that includes the second conductive part 12 and the second gate electrode 22, the on-resistance of the semiconductor device 200 can be reduced compared to the semiconductor device 100 according to the first embodiment.

In particular, in the second region r2 which is the termination region, holes spread and accumulate in the on-state. When the semiconductor device 200 is turned off, the holes that are accumulated in the second region r2 move along the direction of the voltage and are discharged from the semiconductor device 200. The time from the turn-off of the semiconductor device 200 until the holes accumulated in the second region r2 are discharged affects the switching loss of the semiconductor device 200.

Because the on-resistance in the third region r3 is less than the on-resistance in the first region r1, the holes are discharged in the on-state more easily in the third region r3 than in the first region r1. Because the third region r3 in which holes are discharged more easily is located at the second region r2 side, the spreading and accumulation of holes in the second region r2 in the on-state can be suppressed. As a result, the time until the holes are discharged at turn-off can be reduced, and the switching loss of the semiconductor device 200 can be reduced.

In embodiments described above, the relative levels of the impurity concentrations between the semiconductor regions can be confirmed using, for example, a scanning capacitance microscope (SCM). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
a first electrode;
a first semiconductor region located on the first electrode and electrically connected with the first electrode, the first semiconductor region being of a first conductivity type;
a second semiconductor region located on the first semiconductor region, the second semiconductor region being of a second conductivity type;
a third semiconductor region located on a portion of the second semiconductor region, the third semiconductor region being of the first conductivity type;
a first conductive part located in the first semiconductor region with a first insulating part interposed, the first conductive part including an impurity of the second conductivity type;
a first gate electrode located on the first conductive part with a first inter-layer insulating part interposed, the first gate electrode including an impurity of the first conductivity type and facing the second semiconductor region via a first gate insulating layer in a second direction perpendicular to a first direction, the first direction being from the first electrode toward the first semiconductor region; and
a second electrode located on the second and third semiconductor regions and electrically connected with the second semiconductor region, the third semiconductor region, and the first conductive part,
a first-conductivity-type impurity concentration of the first inter-layer insulating part being greater than a first-conductivity-type impurity concentration of the first insulating part,
a second-conductivity-type impurity concentration of the first inter-layer insulating part being greater than a second-conductivity-type impurity concentration of the first insulating part.

2. The device according to claim 1, wherein
the first conductive part includes an impurity of the second conductivity type, and
the first gate electrode includes an impurity of the first conductivity type.

3. The device according to claim 2, further comprising:
a second conductive part located in the first semiconductor region with a second insulating part interposed, the second conductive part including an impurity of the first conductivity type; and
a second gate electrode located on the second conductive part with a second inter-layer insulating part interposed, the second gate electrode including an impurity of the first conductivity type,
the second electrode being electrically connected with the second conductive part.

4. The device according to claim 3, wherein
a plurality of the second semiconductor regions is arranged in the second direction,
a plurality of the third semiconductor regions is located on the plurality of second semiconductor regions,
a plurality of the first conductive parts is located in the first semiconductor region with a plurality of the first insulating parts interposed,
a plurality of the first gate electrodes is located on the plurality of first conductive parts with a plurality of the first inter-layer insulating parts interposed, and the plurality of first gate electrodes faces the plurality of second semiconductor regions with a plurality of the first gate insulating layers interposed in the second direction.

5. The device according to claim 4, wherein
the first semiconductor region includes:
- a first region in which the plurality of first conductive parts is located;
- a second region located around the first region along a first plane perpendicular to the first direction; and
- a third region located between the first region and the second region in the second direction, the second conductive part is located in the third region, and
the plurality of second semiconductor regions is located on the first and third regions.

* * * * *